(12) United States Patent
Suzuki

(10) Patent No.: US 7,038,761 B2
(45) Date of Patent: May 2, 2006

(54) PROJECTION EXPOSURE APPARATUS

(76) Inventor: Masayuki Suzuki, c/o Canon Kabushiki Kaisha, 3-30-2 Shimomaruko, Ohta-ku, Tokyo (JP)

( * ) Notice: Subject to any disclaimer, the term of this patent is extended or adjusted under 35 U.S.C. 154(b) by 65 days.

(21) Appl. No.: 10/764,530

(22) Filed: Jan. 27, 2004

(65) Prior Publication Data

US 2004/0189962 A1 Sep. 30, 2004

Related U.S. Application Data

(62) Division of application No. 09/790,865, filed on Feb. 23, 2001, now Pat. No. 6,707,532.

(30) Foreign Application Priority Data

Feb. 23, 2000 (JP) .............................. 2000-046323

(51) Int. Cl.
- G03B 27/68 (2006.01)
- G03B 27/42 (2006.01)
- G03B 27/34 (2006.01)
- G03B 17/00 (2006.01)

(52) U.S. Cl. .......................... 355/52; 355/53; 355/57; 359/726

(58) Field of Classification Search ................. 355/52, 355/53, 57, 55, 44, 45; 359/726, 730, 732
See application file for complete search history.

(56) References Cited

U.S. PATENT DOCUMENTS

| | | | |
|---|---|---|---|
| 5,311,362 A | 5/1994 | Matsumoto et al. | 359/738 |
| 5,537,260 A | 7/1996 | Williamson | 359/727 |
| 5,583,696 A | 12/1996 | Takahashi | 359/637 |
| 5,729,331 A | 3/1998 | Tanaka et al. | 355/53 |
| 5,835,275 A | 11/1998 | Takahashi et al. | 359/629 |
| 5,835,284 A | 11/1998 | Takahashi et al. | 359/726 |
| 6,249,382 B1 | 6/2001 | Komatsuda | 359/618 |
| 6,366,341 B1 | 4/2002 | Shirato et al. | 355/69 |
| 2002/0012107 A1 | 1/2002 | Suzuki | 355/52 |

FOREIGN PATENT DOCUMENTS

| | | |
|---|---|---|
| EP | 1 039 509 | 4/1998 |
| EP | 0 961 149 | 5/1999 |
| EP | 0 961 149 A2 | 12/1999 |
| EP | 1 039 509 A1 | 9/2000 |
| JP | 6-181162 | 6/1994 |
| JP | 6-300973 | 10/1994 |
| JP | 10-10431 | 1/1998 |
| JP | 10-20195 | 1/1998 |
| WO | WO 98/48451 | 10/1998 |

OTHER PUBLICATIONS

European Search Report dated Aug. 19, 2003, issued in corresponding European patent appln. No. 01 30 1632, forwarded in a Communication dated Aug. 27, 2003.
Communication pursuant to Article 96(2) dated Dec. 9, 2004, from the European Patent Office issued in corresponding European patent application No. 01 301 632.4.

*Primary Examiner*—Peter B. Kim

(57) ABSTRACT

An exposure apparatus includes a projection optical system of catadioptric type, and an optical element disposed on a reciprocating light path of the projection optical system, the optical element being movable to correct at least one of spherical aberration, astigmatism, and curvature of field of the projection optical system.

10 Claims, 8 Drawing Sheets

PROJECTION EXPOSURE APPARATUS

This application is a divisional of U.S. patent application Ser. No. 09/790,865, filed Feb. 23, 2001 now U.S. Pat. No. 6,707,532.

FIELD OF THE INVENTION AND RELATED ART

This invention relates to an exposure apparatus and, more particularly, to a projection exposure apparatus having an ultraviolet light source and a catadioptric projection optical system.

Exposure apparatuses for lithographically printing a pattern of a mask on a wafer are required to provide a higher resolving power. To this end, projection exposure apparatuses having a light source of short wavelength light such as a KrF excimer laser of a wavelength 248 nm, for example, are developed. Further, an ArF excimer laser (193 nm) or $F_2$ laser (157 nm) are used to shorten the wavelength more.

Generally, projection optical systems in projection exposure apparatuses use a dioptric optical system or a catadioptric optical system. However, with light having a short wavelength, usable glass materials are limited and, for this reason, correction of chromatic aberration becomes difficult. On the other hand, a catadioptric type optical system has a large advantage because it is effective with respect to removal of chromatic aberration. There are a few types using a catadioptric optical system. For example, Japanese Laid-Open Patent Application, Laid-Open No. 300973/1994 shows one using a cube type beam splitter. Further, Japanese Laid-Open Patent Application, Laid-Open No. 10431/1998 and corresponding U.S. Pat. No. 5,537,260 show which forms an intermediate image.

FIG. 6 shows a catadioptric reduction optical system such as disclosed in Japanese Laid-Open Patent Application, Laid-Open No. 300973/1994, having a large numerical aperture and being used for semiconductor photography production. Light from a reticle surface 100 goes via a first lens group, a deflecting mirror 20, a second lens group, a beam splitter cube 30, and a quarter waveplate 32, in this order, and it is reflected by a concave mirror 34. The thus reflected light passes again the beam splitter cube 30 and, after being transmitted through a third lens group, it is collected on a wafer surface 50. For further reduction of higher-order aberrations, the concave mirror 34 has an aspherical surface.

FIG. 7 shows a catadioptric optical system such as disclosed in Japanese Laid-Open Patent Application, Laid-Open No. 10431/1998, which is a small-size catadioptric system having a sufficiently large numerical aperture in the image side and work distance, and having a resolution of a quarter-micron unit in the ultraviolet region. Light from an object is reflected by a concave reflection mirror CM of a first imaging optical system S1 and, thereafter, it forms an intermediate image on the light path of the first imaging optical system S1. This intermediate image is then imaged by a second imaging optical system S2 upon the wafer surface, through a first optical path changing member M1. The first imaging optical system S1 has an imaging magnification which is to be set from 0.75 to 0.95, by which the light path deflection by the first light path deflecting member M1 is enabled and, on the other hand, the image side numerical aperture NA of the optical system is made large. Further, the value of L1/LM (L1 is the axial distance between the object plane and the intersection of the optical axes of the first imaging optical system S1 and of the second imaging optical system S2, and LM is the axial distance between the object plane and the concave mirror CM) is set to be from 0.13 to 0.35, by which the image side working distance of the optical system is assured and, additionally, coma and distortion aberration are well corrected.

FIG. 8 shows another example of a catadioptric type projection optical system such as disclosed in Japanese Laid-Open Patent Application, Laid-Open No. 20195/1998 and corresponding U.S. Pat. No. 5,835,275.

However, where an exposure light source such as an ArF excimer laser or $F_2$ laser is used, the absorption of light by glass materials of the projection optical system becomes very large, and therefore, the amount of thermal aberration produced during the exposure process becomes large. Further, the aberration is variable with a change in atmospheric pressure or with illumination conditions.

In order to correct this, a lens or lenses close to the object plane may be moved. However, it needs to take a large change of aberration to the lens motion and, therefore, if the movement distance is large, the mechanical positional precision of the moved lens is degraded. In summary, it is difficult to reduce the aberration to be corrected.

Further, where the numerical aperture (NA) is small, the remaining amount of symmetrical aberrations such as curvature of field and astigmatism, and spherical aberration after correcting the magnification and distortion are small. However, since the remaining amount of symmetrical aberrations such as curvature of field and astigmatism, and spherical aberration increase in proportion to the fourth power or square of the NA, they become a large value not negligible, with a large NA. The NA is becoming large with further miniaturization of a semiconductor device. Thus, it is one of the most important issues to decrease symmetrical aberration.

SUMMARY OF THE INVENTION

It is accordingly an object of the present invention to provide an exposure apparatus by which symmetrical aberrations can be reduced.

In accordance with an aspect of the present invention, there is provided an exposure apparatus, comprising: a projection optical system of catadioptric type; and an optical element disposed on a reciprocating light path of said projection optical system, said optical element being movable to adjust a symmetrical aberration of said projection optical system.

In accordance with another aspect of the present invention, there is provided an exposure apparatus, comprising: a projection optical system of catadioptric type; and an optical element disposed on a reciprocating light path of said projection optical system, said optical element being movable to correct at least one of spherical aberration, astigmatism, and curvature of field.

In these aspects of the present invention, at least one of spherical aberration, astigmatism and curvature of field, produced with heat, pressure or an illumination condition, may be corrected.

The light projected on said optical element may be reflected by a mirror, disposed at an aperture stop position or a position equivalent thereto, and may be directed again to said optical element.

The mirror may comprise a concave mirror or a convex mirror.

The optical element may be disposed adjacent to said mirror.

An ArF laser may be used as an exposure light source, or an $F_2$ laser may be used as an exposure light source.

Coma aberration and distortion aberration as asymmetrical aberrations of said projection optical system may be adjusted by motion of an optical element disposed on a single way of the light path.

In accordance with a further aspect of the present invention, there is provided a device manufacturing method, comprising the steps of: exposing a wafer to a device pattern by use of an exposure apparatus as recited above; and developing the exposed wafer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

[Embodiment 1]

Figure 1:
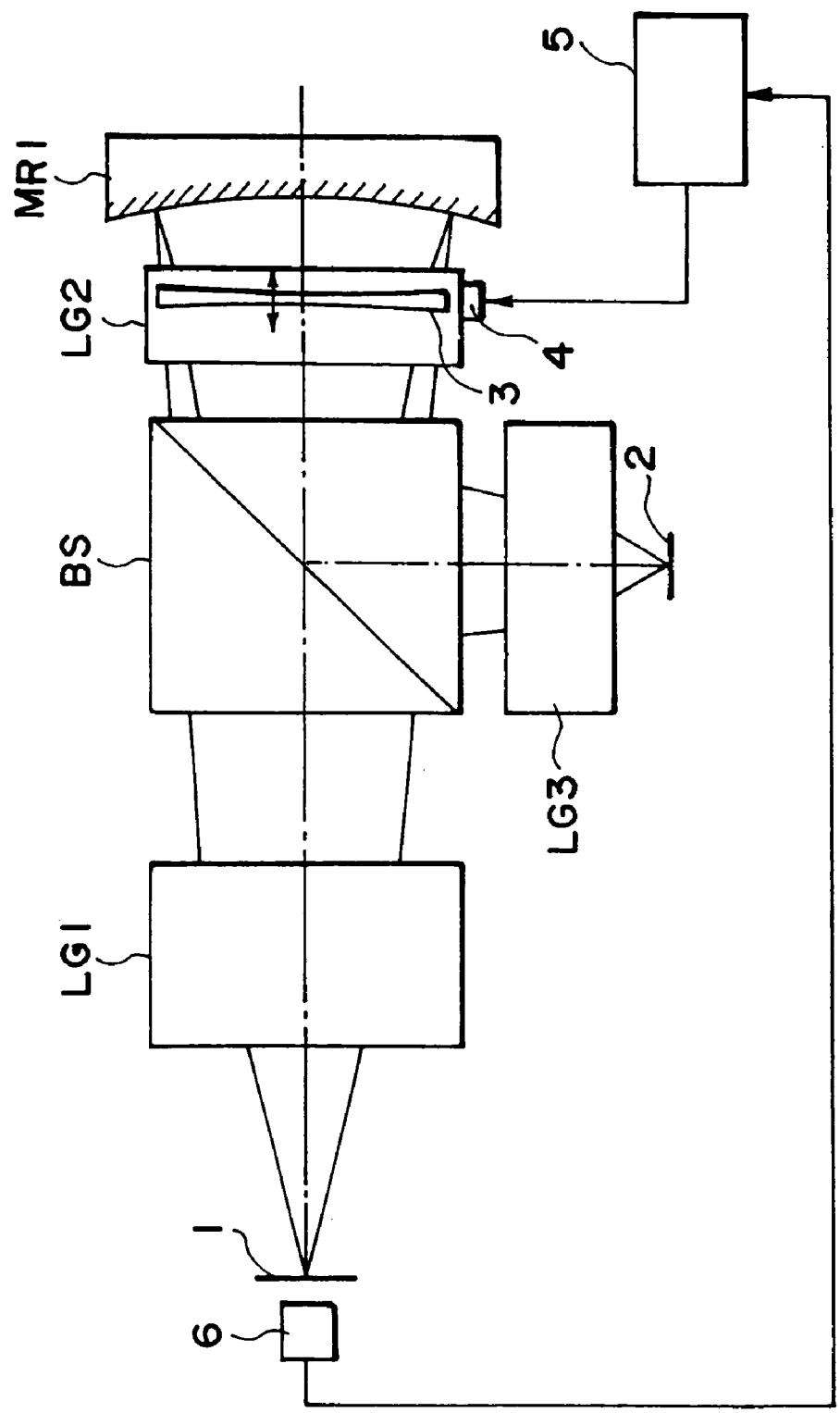
FIG. 1 is a schematic view of a light path of a catadioptric type optical system to be used in an exposure apparatus according to the present invention.

FIG. 1 shows an exposure apparatus according to an embodiment of the present invention, and it comprises a catadioptric type reduction projection optical system having an image plane side NA of 0.65 or more and having a beam splitter, for projecting a pattern of a mask onto a wafer. Denoted in the drawing at 1 is a mask, and denoted at 2 is a wafer. Denoted at LG1–LG3 are first to third lens groups, respectively, and denoted at MR1 is a concave mirror. Denoted at BS is a cube type beam splitter. The exposure apparatus of this embodiment is a scan type exposure apparatus (step-and-scan type) usable in a process of manufacturing various devices such as semiconductor chips (e.g., LSI), liquid crystal panels, CCDs, or magnetic heads, for example. With this exposure apparatus, a wafer is exposed to a device pattern whereby the pattern is printed. The exposed wafer is then developed.

Exposure apparatuses to be described later with reference to other embodiments of the present invention may be of the same type as above.

The first and third lens groups LG1 and LG3 each is a lens group through which light passes only once. The second lens group LG2 is a lens group through which light passes twice (reciprocating transmission). Namely, the second lens group is disposed on a "reciprocating light path". The first and third lens groups are disposed on a "single way of light path".

Denoted at 3 is a lens which is disposed inside the second lens group LG2 and is movable along the optical axis direction. Denoted at 4 is a driving unit for moving the lens 3 in the optical axis direction. Denoted at 5 is a control unit for controlling the motion of the lens 3 through the driving unit 4. Denoted at 6 is an aberration measuring unit.

Light emitted from the mask 1 goes through the first lens group LG1, the beam splitter BS and then the second lens group LG2. Thereafter, it impinges on the concave mirror MR1 and is reflected thereby.

The light reflected by the concave mirror MR1 again goes through the second lens group LG2 and enters the beam splitter BS. The light is then reflected by the beam splitter whereby it is deflected by 90 deg., and is emitted. The light then passes through the third lens group LG3 and, after that, the light is collected on the wafer 2, whereby an image is formed there.

As the exposure process starts, a portion of the exposure light is absorbed by the lens material or mirror material, by which the temperature of the lens or mirror material is raised. With this temperature rise, the lens material or mirror material expands so that the surface shape and the surface spacing (interval) thereof change although it is small. Further, as regards the lens material, the absolute value of the refractive index thereof changes and, in addition thereto, the refractive index distribution thereof also changes. With these changes, the focus position changes and, additionally, there occurs a small aberration. As a result, even if the focus is adjusted, there remains slight degradation of image performance.

Additionally, since a change in atmospheric pressure or illumination condition causes an aberration, this leads to a change in image performance.

In consideration of this, the control unit 5 operates to determine the driving amount corresponding to the movement amount of the lens 3, on the basis of the exposure amount, exposure time or any other exposure condition, and it actuates the driving unit 4. With this operation, the lens 3 moves along the optical axis direction by a predetermined amount thus determined, such that the produced symmetric aberration is corrected. The control unit 5 performs the open-loop control such as described, but also it can perform a closed-loop control for moving the lens 3 so as to correct the aberration where aberration information about the projection optical system is available by use of an aberration measuring unit of known type. With such motion of the lens 3, symmetrical aberration can be corrected effectively.

Figure 2:
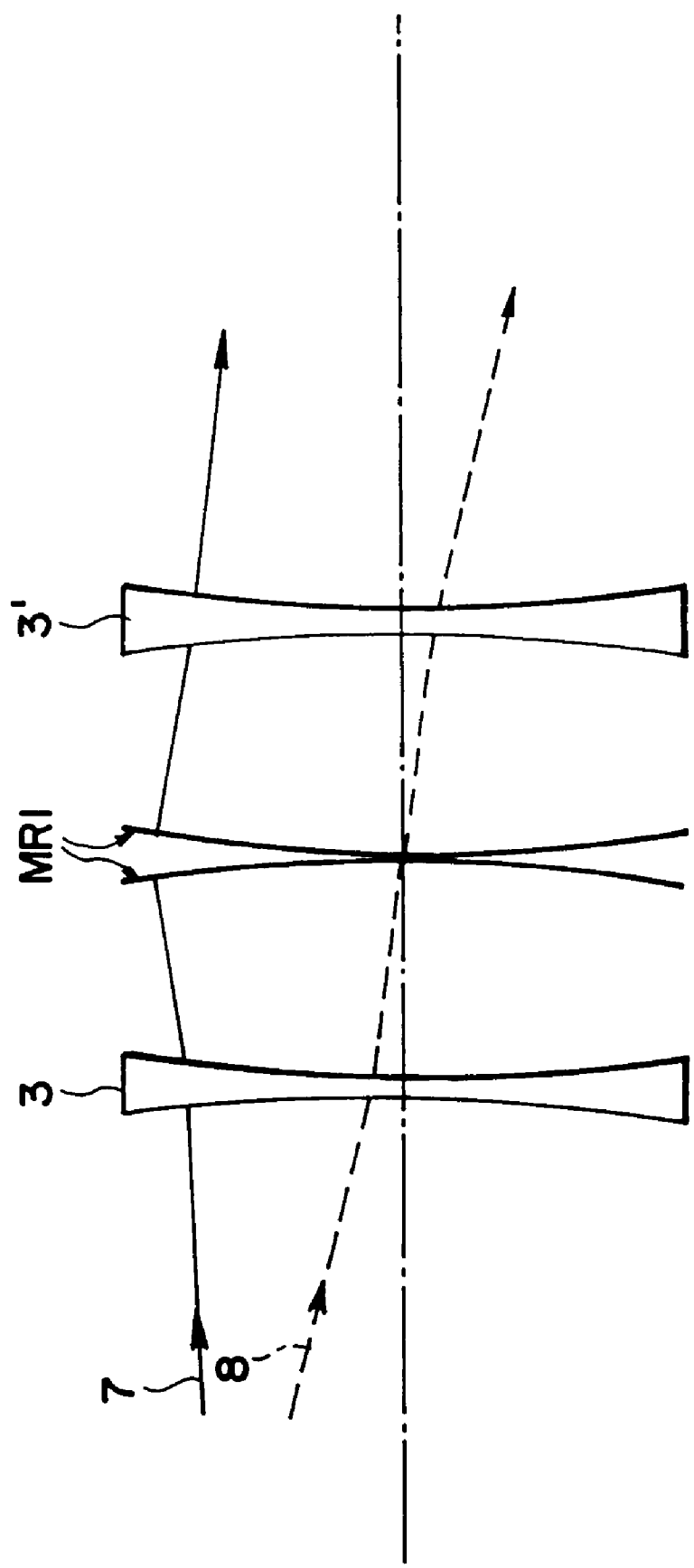
FIG. 2 is a schematic view for explaining aberration of a catadioptric optical system.

FIG. 2 is a schematic view for explaining aberrations produced in the vicinity of the concave mirror MR1 of FIG. 1.

For better understanding, the optical path is shown in terms of transmission at the concave mirror MR1. The light passes through the lens 3 from left to right in FIG. 2, and then it is reflected by the concave mirror MR1. Actually, the light is reflected leftwardly (in opposite direction) and it passes again the lens 3 leftwardly. In FIG. 2, the light is illustrated as being directed rightwardly after reflection by the mirror MR1, so that it passes a lens 3' being symmetrical with the lens 3 with respect to the mirror MR1.

Denoted at 7 is marginal (peripheral) light among the imaging light. Denoted at 8 is a chief ray of the imaging light.

The mirror MR1 is disposed at a position equivalent to (which may be optically conjugate with) an aperture stop position.

Since the lenses 3 and 3' are asymmetrical with each other with respect to the aperture stop, any asymmetrical aberrations such as coma aberration and distortion aberration to be produced by the lenses 3 and 3' have opposite signs and, thus, they can be cancelled with each other when combined. As a result, only a very small aberration remains.

On the other hand, regarding any symmetric aberrations such as spherical aberration, astigmatism and curvature of field, for example, those produced by the lenses 3 and 3' have the same sign and they are combined with each other. Therefore, a large aberration is produced, as compared with a case where only one lens is used (the light passes only once). When the concave mirror MR1 and the lenses 3 and 3' are placed close to each other, the amount of aberration will become about twice larger than a case where only one lens is used.

In summary, a large aberration to be produced at the lenses 3 and 3' is symmetrical aberration only. Asymmetric aberration is small.

This means that, when the spacing between the concave mirror MR1 and the lenses 3 and 3' is changed symmetrically, only the symmetrical aberration changes largely. There occurs approximately no change in the asymmetric aberration.

Thus, by moving a lens element (elements) which is close to a concave mirror and through which the light passes twice, as described above, only symmetrical aberration can be changed largely without a large influence to the asymmetric aberration. Therefore, by moving an optical element such as the lens 3 which is contributable to the symmetric aberration, in the optical axis direction, for example, the symmetric aberration can be corrected effectively.

[Embodiment 2]

Figure 3:
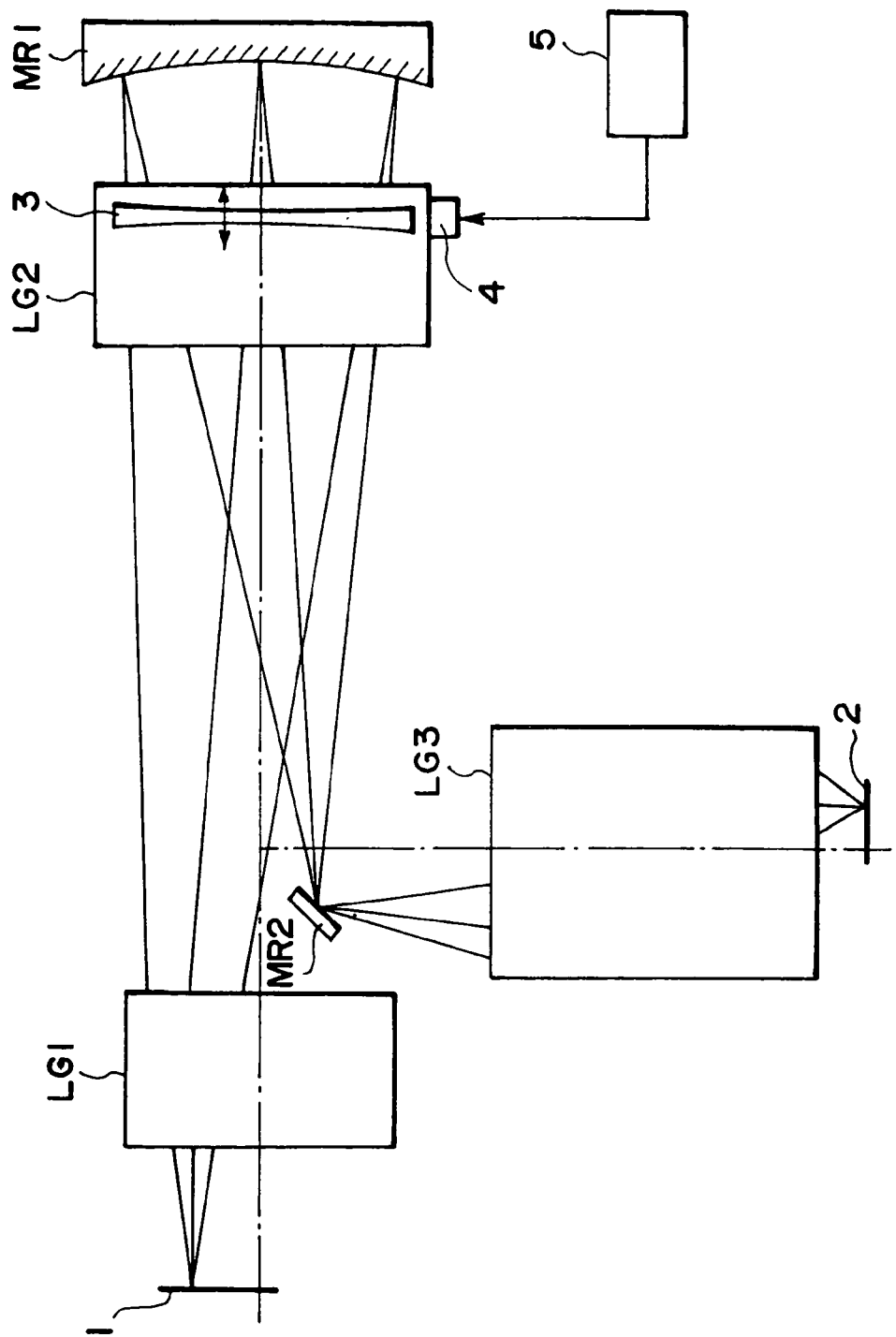
FIG. 3 is a schematic view of a light path of a catadioptric optical system having a deflecting mirror.

FIG. 3 shows an exposure apparatus according to another embodiment of the present invention, and it comprises a catadioptric type reduction projection optical system having a deflecting mirror, in place of a beam splitter, and having an image plane side NA of 0.65 or more, for projecting a pattern of a mask onto a wafer. Denoted in the drawing at 1 is a mask, and denoted at 2 is a wafer. Denoted at LG1–LG3 are first to third lens groups, respectively, and denoted at MR1 is a concave mirror. Denoted at MR2 is a deflecting mirror.

The first and third lens groups LG1 and LG3 each is a lens group through which light passes only once. The second lens group LG2 is a lens group through which light passes twice (reciprocating transmission). Namely, the second lens group is disposed on a "reciprocating light path". The first and third lens groups are disposed on a "single way of light path".

Denoted at 3 is a lens which is disposed inside the second lens group LG2 and is movable along the optical axis direction. Denoted at 4 is a driving unit for moving the lens 3 in the optical axis direction. Denoted at 5 is a control unit for controlling the motion of the lens 3 through the driving unit 4.

Light emitted from the mask 1 goes through the first lens group LG1 and the second lens group LG2, and thereafter, it impinges on the concave mirror MR1 and is reflected thereby.

The light reflected by the concave mirror MR1 again goes through the second lens group LG2, and then it forms an intermediate image. Here, the light is deflected by 90 deg., by means of the deflecting mirror 14R2 disposed adjacent to the intermediate image. The light then passes through the third lens group LG3 and, after that, the light is collected on the wafer 2, whereby an image is formed there.

As the exposure process starts, a portion of the exposure light is similarly absorbed by the lens material or mirror material. This causes a temperature rise of the lens or mirror material, and produces small aberrations. As a result, even if the focus is adjusted, there remains slight degradation of image performance. Additionally, a change in atmospheric pressure or illumination condition causes a change in image performance.

In consideration of this, the control unit 5 operates to determine the driving amount, on the basis of the exposure amount, exposure time or any other exposure condition, and it actuates the driving unit 4. With this operation, the lens 3 which is an optical element contributable to the symmetric aberration moves along the optical axis direction by a predetermined amount thus determined, such that the produced symmetric aberration is corrected. The control unit 5 performs the open-loop control such as described, but also it can perform a closed-loop control for moving the lens 3 so as to correct the aberration where aberration information about the projection optical system is available by use of an aberration measuring unit of known type.

In this embodiment, like the preceding embodiment, only symmetrical aberration can be corrected efficiently without a large influence to the asymmetric aberration.

[Embodiment 3]

Figure 4:
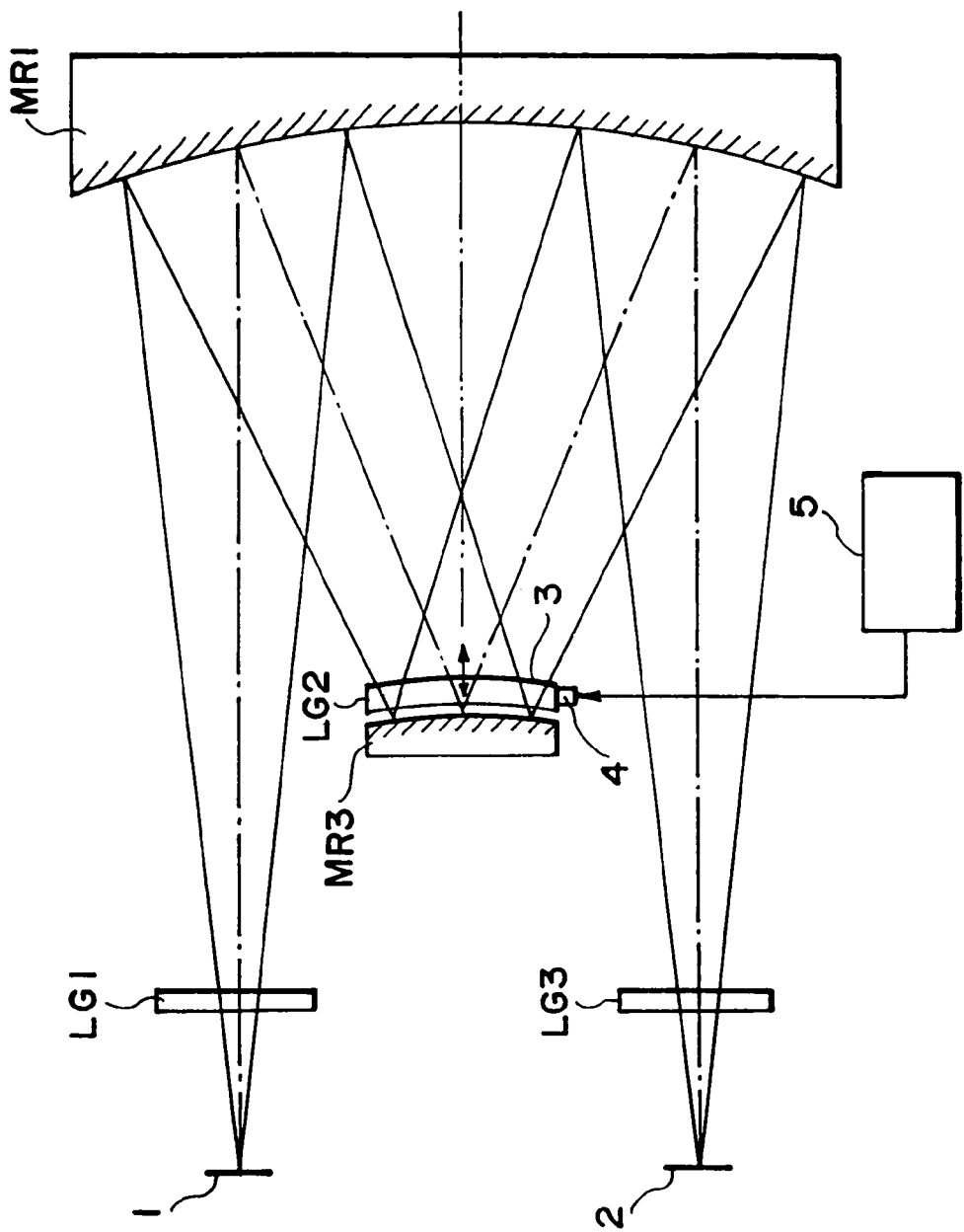
FIG. 4 is a schematic view of another type of catadioptric optical system having no beam splitter.

FIG. 4 shows an exposure apparatus according to a further embodiment of the present invention, and it comprises a catadioptric type unit-magnification projection optical system, without having a beam splitter, for projecting a pattern of a mask onto a wafer. Denoted in the drawing at 1 is a mask, and denoted at 2 is a wafer. Denoted at LG1–LG3 are first to third lens groups, respectively. Denoted at MR1 is a concave mirror, and denoted at MR2 is a convex mirror.

The first and third lens groups LG1 and LG3 each is a lens group through which light passes only once. The second lens group LG2 is a lens group through which light passes twice (reciprocating transmission). Namely, the second lens group is disposed on a "reciprocating light path". The first and third lens groups are disposed on a "single way of light path".

Denoted at 3 is a lens which is disposed inside the second lens group LG2 and is movable along the optical axis direction. Denoted at 4 is a driving unit for moving the lens 3 in the optical axis direction. Denoted at 5 is a control unit for controlling the motion of the lens 3 through the driving unit 4.

In this embodiment, the second lens group consists of the lens 3 only. The lens group LG1 or LG3 may include a parallel flat plate or, alternatively, each of them may be provided a parallel flat plate only.

In FIG. 4, the light emitted from the mask 1 goes through the first lens group LG1 and it is reflected by the concave mirror MR1. After this, it passes through the lens 3 which constitutes the second lens group LG2, and thereafter, it is reflected by the concave mirror MR3. Then, the light again passes through the lens 3, and it is reflected by the concave mirror MR1. Then, the light passes through the lens group LG3, and, after that, the light is collected on the wafer 2, whereby an image is formed there.

Also in this embodiment, the control unit 5 operates to determine the driving amount, on the basis of the exposure amount, exposure time or any other exposure condition, and it actuates the driving unit 4. With this operation, the lens 3 which is an optical element contributable to the symmetric aberration moves along the optical axis direction by a predetermined amount thus determined, such that the produced symmetric aberration is corrected. The control unit 5 performs the open-loop control such as described, but also it can perform a closed-loop control for moving the lens 3 so as to correct the aberration where aberration information about the projection optical system is available by use of an aberration measuring unit of known type.

In this embodiment, like the first embodiment, only symmetrical aberration can be corrected efficiently.

While the foregoing description has been made to cases wherein the present invention is applied to three types of projection optical systems, the present invention can be applied to any other type of catadioptric projection optical systems.

Further, while the invention has been described with reference to motion of a single lens for convenience in explanation, plural lenses in the reciprocating light path may be moved.

Further, if both of symmetric aberration and asymmetric aberration should be corrected, for correction of symmetric aberration, a lens (optical element contributable to that aberration) through which light passes twice may be selected and, on the other hand, for correction of asymmetric aberration, a lens (optical element contributable to that aberration) through which light passes once may be selected, and these lenses may be moved respectively. This enables efficient correction of both of the symmetric aberration and the asymmetric aberration.

This will be described in more detail with reference to a fourth embodiment, below.

[Embodiment 4]

Figure 5:
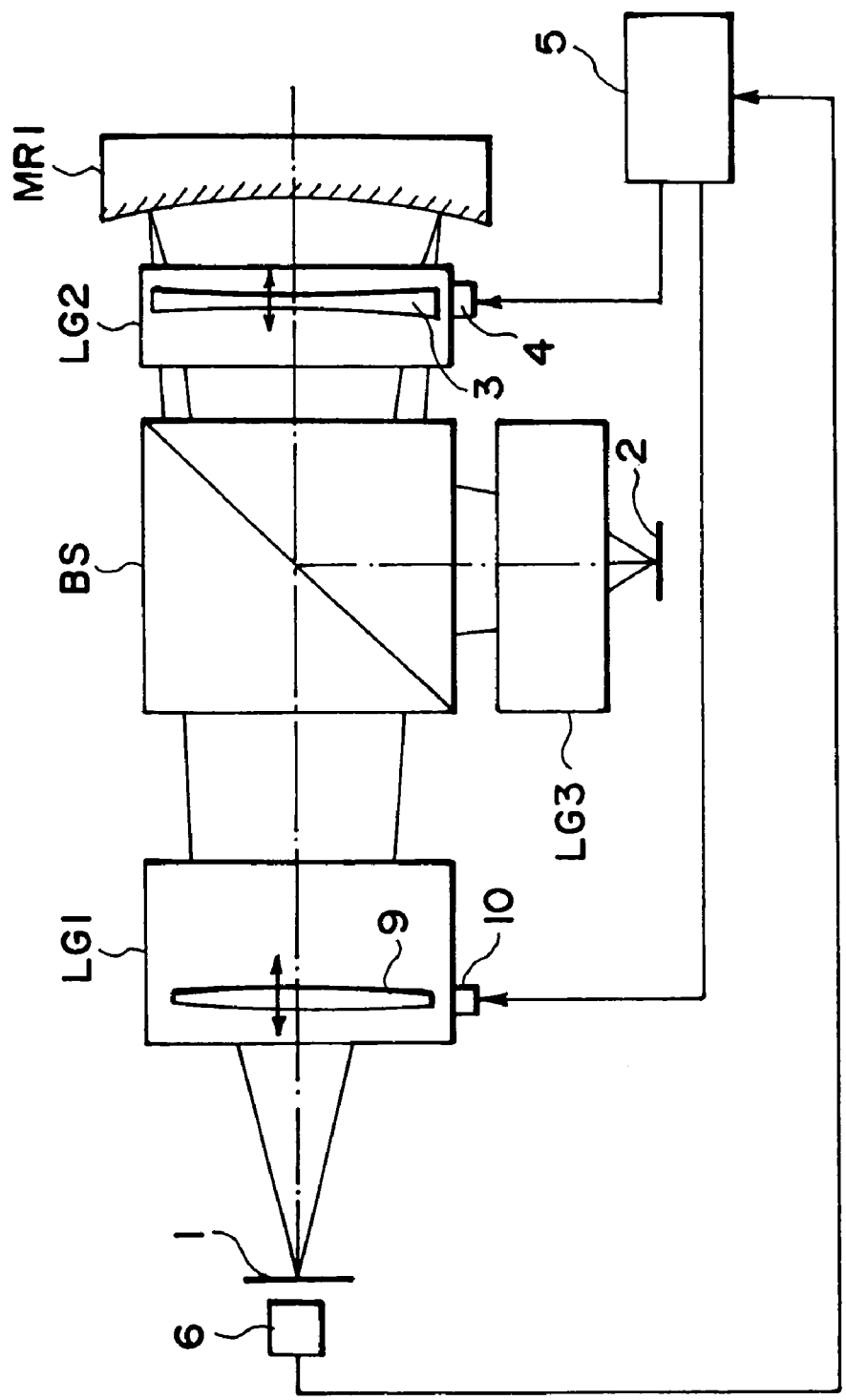
FIG. 5 is a schematic view of a light path of a catadioptric optical system being provided with means for correcting asymmetrical aberration.
Figure 6:
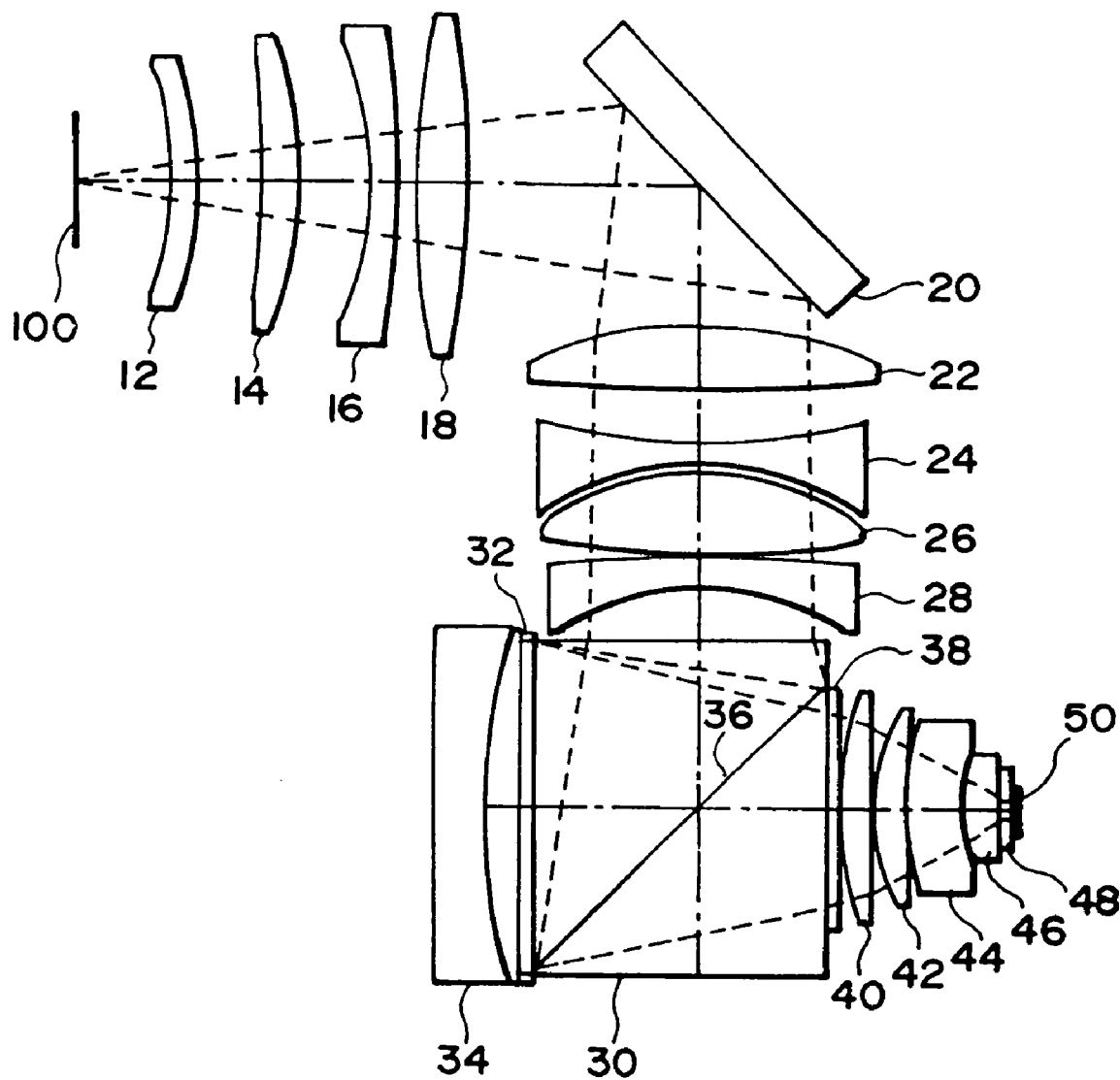
FIG. 6 is a schematic view of a light path of a conventional catadioptric optical system having a beam splitter.
Figure 7:
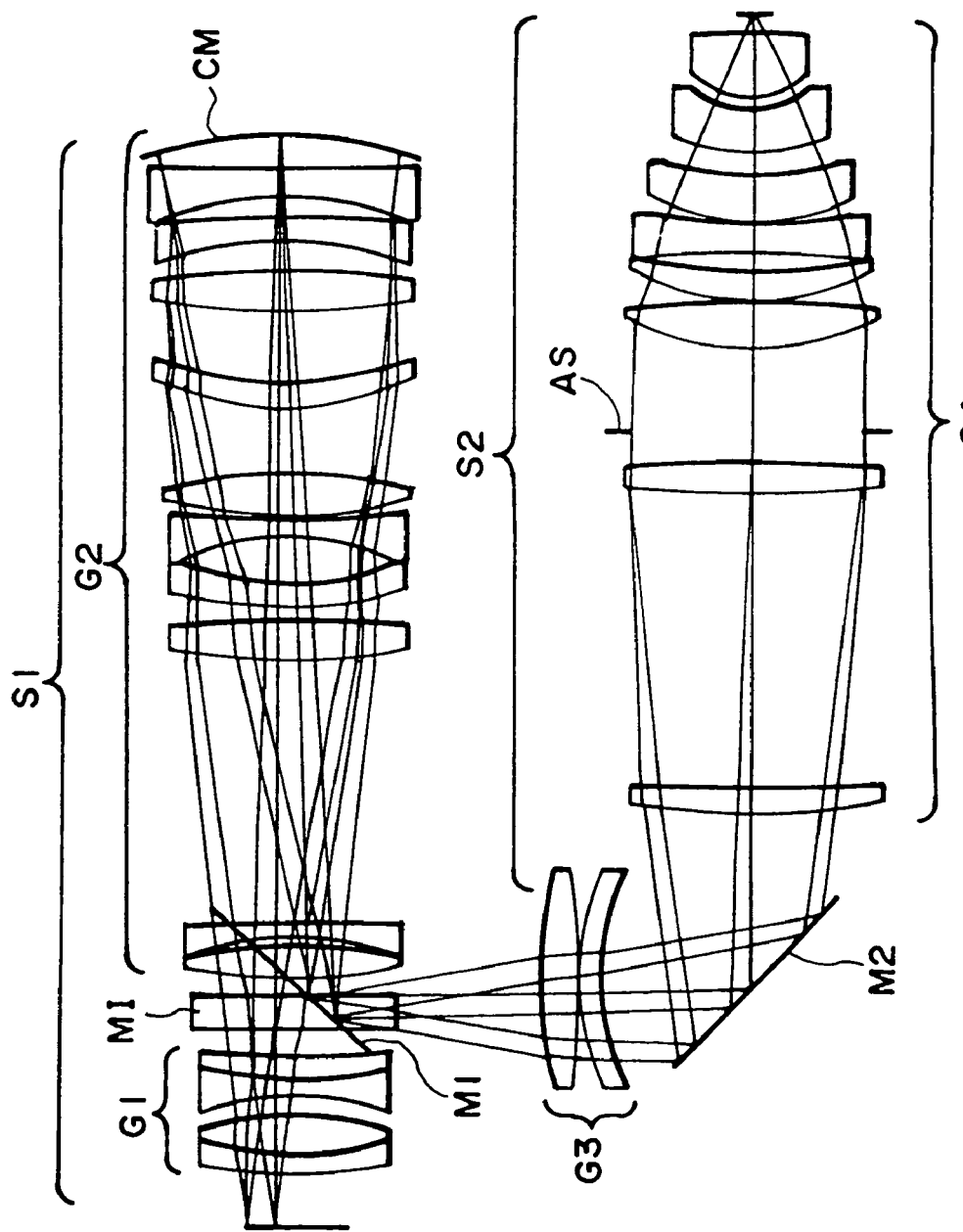
FIG. 7 is a schematic view of a light path of a conventional catadioptric optical system in which an intermediate image is formed.

FIG. 5 shows a further embodiment of the present invention, in which a pattern of a mask is projected onto a wafer by use of a projection optical system which is similar to that shown in FIG. 1 and which is additionally provided with means for correcting asymmetric aberration. Denoted at 9 in the drawing is a lens which is disposed inside a first lens group LG1 and which is movable along the optical axis both of symmetric aberration such as spherical aberration, astigmatism and curvature of field and asymmetric aberration such as coma and distortion, can be corrected.

When aberrations are produced for these reasons, first, the lens 9 inside the first lens group LG1 is moved in the optical axis direction, by which asymmetric aberration is corrected.

When the NA of the optical system is large, motion of the lens 9 causes a small change in symmetric aberration thereof. Thus, the lens 3 inside the second lens group LG2 may be moved in the optical axis direction, while also taking this aberration change into account. With this operation, the symmetric aberration can be corrected substantially without changing the asymmetric aberration. In this embodiment, through the procedure described above, both the asymmetric aberration and the symmetric aberration can be corrected. This technology can be applied to the second and third embodiments described above.

In the above-described example, correction of asymmetric aberration is made first and correction of symmetric aberration is made second. However, the order may be reversed. Further, correction of asymmetric aberration and correction of symmetric aberration may be made alternately, to further enhance the correction precision.

Figure 8:
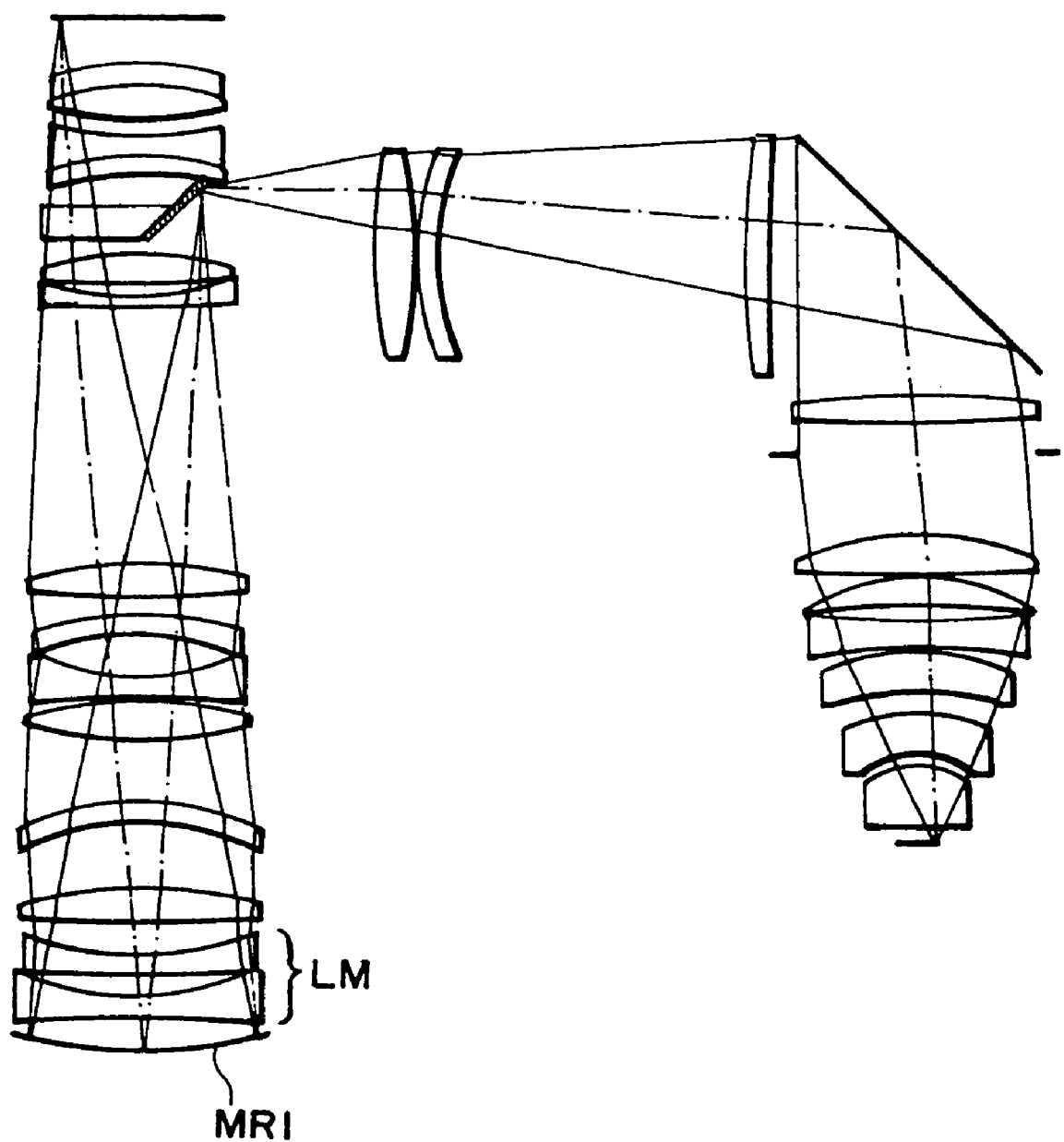
FIG. 8 is a schematic view of a light path of a catoptric system such as disclosed in Japanese Laid-Open Patent Application, Laid-Open No. 20195/1998.

The present invention can be applied to a conventional projection optical system. Here, such an embodiment will be described with reference to FIG. 8. FIG. 8 shows a conventional catadioptric type projection optical system such as disclosed in Japanese Laid-Open Patent Application, Laid-Open No. 20195/1998, for example. A lens or lenses adjacent to a concave mirror, in the reciprocating light path, in this optical system may be moved along the optical axis direction. The amount of changes in aberration caused by such lens motion will be described.

Table 1 below shows aberrations on an occasion when the two concave lenses (LM) in the reciprocating light path, adjacent the concave mirror MR1, are moved simultaneously along the optical axis direction (toward the concave mirror) by 1 micron.

TABLE 1

|  | REFERENCE STATE | AFTER LENS MOTION | AMOUNT OF CHANGE |
|---|---|---|---|
| SPHERICAL ABERRATION (NA: 0.6) | 1.81 µm | 1.67 µm | −0.14 µm |
| WAVEFRONT ABERRATION SYMMETRIC COMPONENT | −0.358 λ | −0.445 λ | −0.087 λ |
| WAVEFRONT ABERRATION ASYMMETRIC COMPONENT (NA: 0.6, MAX. IMAGE HEIGHT) | −0.009 λ | −0.040 λ | −0.031 λ |
| SAGITTAL CURVATURE OF FIELD (MAX. IMAGE HEIGHT) | 0.45 µmm | 0.44 µm | −0.01 µm |
| MERIDIONAL CURVATURE OF FIELD (MAX. IMAGE HEIGHT) | 0.25 µm | 0.24 µm | −0.01 µm |
| IMAGING POINT POSITIONAL DEVIATION (MAG. CHANGE + DISTORTION) | −0.007 µm | 0.027 µm | 0.034 µm | direction. Denoted at 10 is a driving unit for moving the lens 9. The control unit 5 can operate to control both of the driving units 4 and 10.

In this embodiment, in regard to various aberrations to be produced by a temperature change due to the exposure process or a change in pressure or in illumination condition, In this example, since the spherical aberration changes large, the lens system LM is used for adjustment of the spherical aberration. At the same time, coma aberration (wavefront aberration asymmetric component) or imaging point positional deviation (due to a change in magnification or in distortion aberration) will change slightly.

Thus, when the present invention is applied to this embodiment, not only may the lens system LM at the reciprocating light path shown be moved but also some lenses at the single way of light path may be moved along the optical axis direction. This enables correction of varying magnification and distortion aberrations as well as coma aberration.

In accordance with the embodiments of the present invention as described above, a lens which is adjacent to an aperture stop (pupil) position and disposed at a reciprocating light path so that light passes therethrough twice, is moved along the optical axis direction, thereby to correct symmetric aberrations. With this arrangement, the symmetric aberration changes largely as compared with a case where a lens at a single way of light path is moved. Thus, the range for correctable aberration becomes larger. Further when the aberration correction of the same amount is made, it can be done with a shorter stroke and in a shorter time.

Additionally, only symmetric aberration can be corrected without substantially changing asymmetric aberration. This makes the aberration control much easier.

The advantageous effects of the present invention are particularly notable where absorption of light by the glass material or mirror is large. Therefore, the present invention is very effective when used with an ArF laser or $F_2$ laser.

When the NA is large such as 0.65 or more, the change in aberration due to a change in temperature or pressure or a change in illumination condition becomes large. Thus, the present invention provides a large effect when used in an optical system having a large NA.

In accordance with the present invention, as described above, symmetric aberration of a catadioptric optical system can be adjusted and corrected very effectively.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus comprising:
   a projection optical system of a catadioptric type; and
   an optical element disposed on a reciprocating light path of said projection optical system, said optical element being movable along an optical axis of said projection optical system to change aberration of said projection optical system to be produced due to exposure.

2. An apparatus according to claim 1, wherein the aberration includes at least one of spherical aberration, astigmatism and curvature of field.

3. An apparatus according to claim 1, wherein the aberration is produced as a result of at least one of pressure, heat and an illumination condition.

4. An exposure apparatus comprising:
   a projection optical system of a catadioptric type, said projection optical system including (i) a first mirror for reflecting light from a light source thereby to define a reciprocating light path, and (ii) a second mirror disposed at a position not intercepting a path of the light from the light source to the first mirror, for directing light from the first mirror along a one-way light path off the reciprocating light path; and
   an optical element disposed on the reciprocating light path of said projection optical system, said optical element being movable along an optical axis of said projection optical system to change aberration of said projection optical system.

5. An apparatus according to claim 4, wherein the aberration includes at least one of spherical aberration, astigmatism and curvature of field.

6. An exposure apparatus comprising:
   a projection optical system of a catadioptric type;
   an optical element disposed on a reciprocating light path of said projection optical system; and
   an actuator for actuating said optical element along an optical axis of said projection optical system to change aberration of said projection optical system.

7. An apparatus according to claim 6, wherein the aberration includes at least one of spherical aberration, astigmatism and curvature of field.

8. An exposure apparatus comprising:
   a projection optical system of a catadioptric type, said projection optical system including an optical element disposed on a reciprocating light path of said projection optical system at a position where a light passing region of the light traveling along a forward light path and a light passing region of the light traveling along a backward light path are overlapped with each other, said optical element being movable along an optical axis of said projection optical system.

9. An apparatus according to claim 8, wherein said optical element is movable to change aberration of said projection optical system.

10. An apparatus according to claim 9, wherein the aberration includes at least one of spherical aberration, astigmatism and curvature of field.

* * * * *

UNITED STATES PATENT AND TRADEMARK OFFICE
CERTIFICATE OF CORRECTION

PATENT NO. : 7,038,761 B2 Page 1 of 1
APPLICATION NO. : 10/764530
DATED : May 2, 2006
INVENTOR(S) : Masayuki Suzuki It is certified that error appears in the above-identified patent and that said Letters Patent is hereby corrected as shown below:

ON THE TITLE PAGE:
 In item "(76) Inventor:," the inventor information "Masayuki Suzuki, c/o Canon Kabushiki Kaisha, 3-30-2 Shimomaruko, Ohta-ku, Tokyo (JP)"

should read -- Masayuki Suzuki, Utsunomiya (JP) --.

After item "(76) Inventor:," please insert the following

-- (73) Assignee: Canon Kabushiki Kaisha, Tokyo (JP) --.

After item "*Primary Examiner* - Peter B. Kim," please insert the following:

-- (74) *Attorney, Agent, or Firm* - Fitzpatrick, Cella, Harper & Scinto --.

COLUMN 5:
 Line 66, "14R2" should read -- MR2 --.

COLUMN 9:
 Line 16, "Further" should read -- Further, --.

Signed and Sealed this

Ninth Day of January, 2007

JON W. DUDAS
*Director of the United States Patent and Trademark Office*